United States Patent [19]

Alugbin et al.

[11] Patent Number: 5,268,332
[45] Date of Patent: Dec. 7, 1993

[54] METHOD OF INTEGRATED CIRCUIT FABRICATION HAVING PLANARIZED DIELECTRICS

[75] Inventors: Dayo Alugbin, Bethlehem; Franklin D. Nkansah, Allentown; Kolawole R. Olasupo, Kutztown, all of Pa.

[73] Assignee: AT&T Bell Laboratories, Murray Hill, N.J.

[21] Appl. No.: 975,235

[22] Filed: Nov. 12, 1992

[51] Int. Cl.⁵ .................................................. H01L 21/465
[52] U.S. Cl. ........................................ 437/228; 437/194; 437/235; 437/947; 437/981; 156/644
[58] Field of Search ................. 437/228, 195, 60; 156/643, 656

[56] References Cited

U.S. PATENT DOCUMENTS

| 4,814,041 | 3/1989 | Auda | 156/643 |
| 5,022,958 | 6/1991 | Favreau et al. | 156/643 |

Primary Examiner—Olik Chaudhuri
Assistant Examiner—H. Jey Tsai
Attorney, Agent, or Firm—John T. Rehberg

[57] ABSTRACT

A method for forming an integrated circuit with a planarized dielectric is disclosed. Runners and gates are covered with a protective dielectric layer. Then a conventional dielectric is deposited and planarized over the entire circuit surface. When windows are opened to runners and to source/drain regions, the protective dielectric helps to slow the etch process over the runner, thus protecting the runner from damage during the extra time required for the etch process to reach the source or drain.

9 Claims, 2 Drawing Sheets

METHOD OF INTEGRATED CIRCUIT FABRICATION HAVING PLANARIZED DIELECTRICS

TECHNICAL FIELD

The present invention relates to integrated circuits in general, and more particularly to integrated circuits having planarized dielectrics and methods for their fabrication.

BACKGROUND OF THE INVENTION

In the production of integrated circuits, it is often necessary to form openings, termed "windows" (also termed "contacts" or "vias") in one or more dielectric layers so that electrical contact may be made to underlying regions or conductors. After a window is opened, a conductive material is deposited within the window. Conductive material may also be deposited over the dielectric. The conductive layer is then lithographically patterned to form electrical conductors, often termed "runners." As integrated circuit dimensions have shrunk to below one micron, it has become increasingly common to planarize the dielectric layer prior to forming the windows. The planarization process yields a flatter dielectric surface for subsequent lithographic operations which may be performed to pattern the dielectric or the subsequently formed conductive layers. In other words, a planar surface reduces the depth of field requirements for the optical system used to expose the resist layer that defines the pattern. In addition, planarization of the first dielectric layer (i.e., the dielectric layer adjacent the gate and source/drain regions) facilitates the patterning of subsequent dielectrics and conductive layers in so-called multi-level metal processes.

Various techniques have been developed to planarize dielectric layers. One technique, referred to as a "resist etchback," involves depositing a resist material on the surface to be planarized. Since the resist is a liquid, its top surface assumes a flat profile regardless of the underlying irregularities. A plasma etch of the hardened resist and the underlying dielectric causes the flat surface of the resist to be transferred into the underlying dielectric since the etch rate of the resist is chosen to be similar to that of the dielectric. In another technique, a mechanical wafer polisher is used to planarize the surface of the dielectric.

Unfortunately, planarization, though desirable for the reasons mentioned above, presents certain problems in subsequent processing. After a dielectric layer has been planarized, it is necessary, as mentioned above, to open windows by etching the dielectric. Since the thickness of the planarized dielectric varies with respect to the underlying topographic features, the window etching procedure may overetch and damage certain of these underlying topographic features. For example, in a typical FET window etching process, gate runners which extend over field oxides may be damaged by etching processes which are designed to open windows to source and drain regions as well as gate runners.

SUMMARY OF THE INVENTION

Illustratively, the etching problem is addressed by the present invention which includes forming a raised topographic feature upon a substrate; and forming a first layer upon the topographic feature; the first layer does not cover the substrate and it has a predetermined thickness. Then a second layer is formed upon the first layer and upon the substrate. The second layer is then planarized. The first and second layers are selectively etched to create first and second openings; the first opening is over the topographic feature and the second opening is over the substrate. The thickness of the first layer is chosen so that the first opening exposes the topographic feature at the same time that the second opening exposes the substrate.

Illustratively, the topographic feature may be a gate or runner.

DETAILED DESCRIPTION

Figure 1:
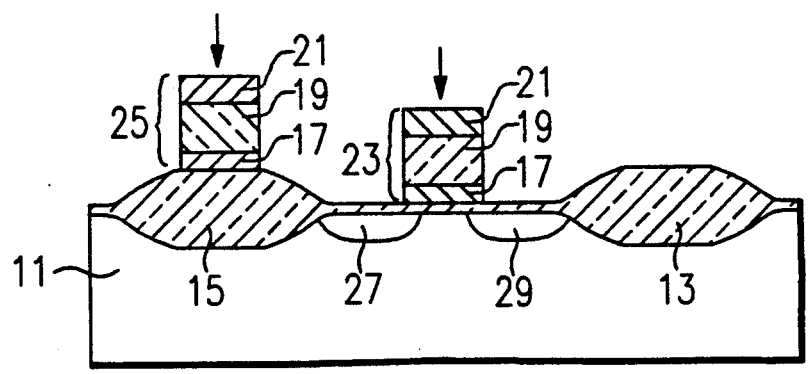
FIGS. 1-5 are cross-sectional views which schematically show an illustrative embodiment of the present invention.

Referring to FIG. 1, a partially-fabricated portion of a MOS integrated circuit is shown. Reference numeral 11 denotes a substrate which may be silicon, epitaxial silicon, doped silicon, etc. Reference numerals 13 and 15 denote field oxides which may, for example, be formed by the LOCOS (local oxidation of silicon) process. Reference numerals 17 and 19 denote, respectively, gate dielectric (which is typically silicon dioxide, although silicon oxynitride may be considered suitable) and gate conductor which is a conductive material such as polysilicon.

Reference numeral 21 denotes a dielectric material which, illustratively, may be an oxide of silicon formed from TEOS. The structure of FIG. 1 may be formed (after definition of field oxides 13 and 15) by depositing a blanket dielectric layer, followed by a blanket conductive layer, followed by a blanket dielectric layer. A photoresist is spun on top of the three layers and subsequently patterned. The patterned photoresist is then used as a mask to etch the underlying dielectric layer. After the underlying dielectric layer is etched, the photoresist may be optionally removed and the already-etched dielectric used as a mask for etching the underlying conductor. Alternatively, the photoresist may be permitted to remain in place. The term "hard mask" etching is applied to those processes in which the overlying dielectric serves as a mask for etching an underlying layer.

After the etching process is completed, gate 19 and runner 25 are defined. The thickness of overlying dielectric layer 21 is chosen with particular care as will be described below.

After definition of gate 19 source and drain regions 27 and 29 may be formed, typically, by ion implantation.

Figure 2:
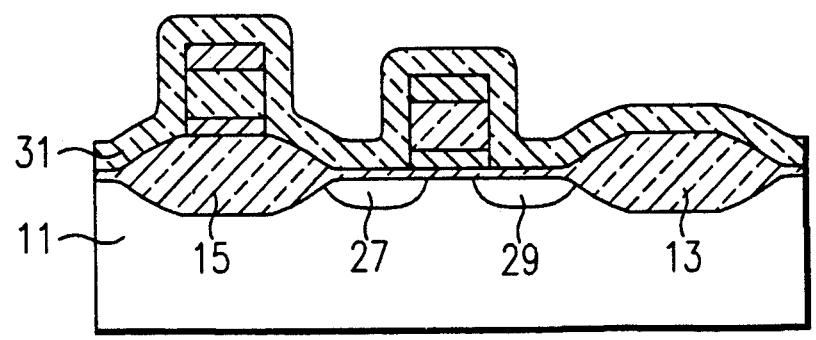
Figure 3:
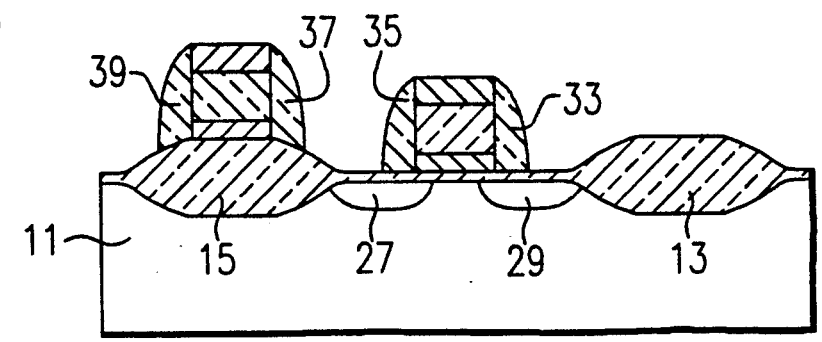

Turning to FIGS. 2 and 3, dielectric layer 31 may (optionally) be blanket deposited and subsequently etched to form spacers 33, 35, 37 and 39. The use of single layer or multi-layered spacers is optional.

Figure 4:
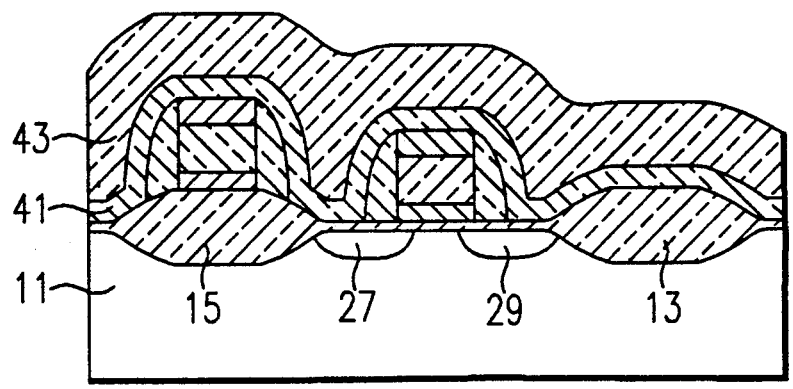

Turning to FIG. 4, a dielectric layer 41 which may, illustratively, be TEOS is formed. Then a second dielectric layer 43 which, illustratively, may be TEOS doped with dopants such as boron and/or phosphorus, is formed over layer 41.

Figure 5:
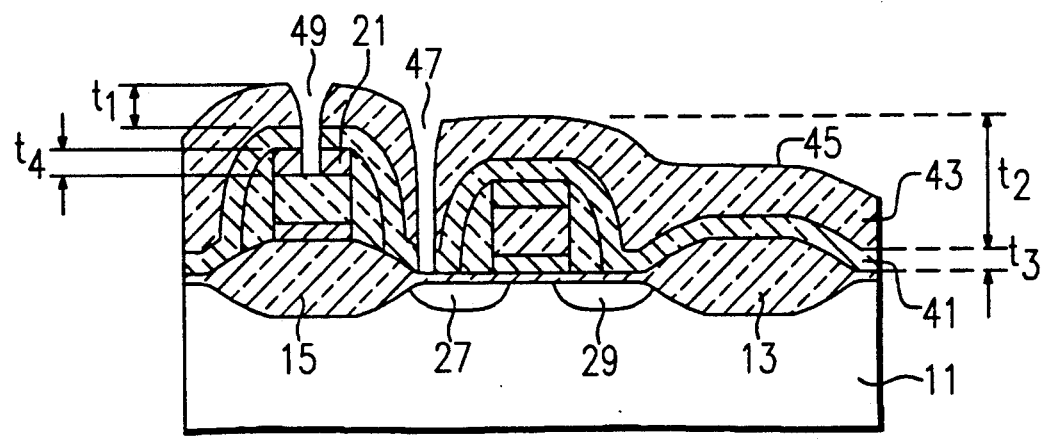

In FIG. 5 dielectric 43 is either smoothed or planarized, thereby producing smooth or planarized upper surface 45.

It is desired to open window 47 to junction 27 and window 49 to runner 25 in a single etching step. (During subsequent processing, windows 47 and 49 will be filled with conductive materials.) Dielectric material 43 (which is typically BPTEOS) is chosen to have an etch rate which is faster than that of dielectric 41 (which is typically undoped TEOS). Dielectric layer 21 which caps runner 25 is also chosen to have an etch rate which is slower than the etch rate of dielectric layer 43. Examination of FIG. 5 shows that the etching process over runner 25 must first traverse a thickness $t_1$ of relatively fast etching dielectric 43 and then traverse thickness $t_3$ of slower etching dielectric 41 and thickness $t_4$ of slower etching dielectric 21. At the same time, the etching process over junction 27 must traverse thickness $t_2$ of relatively fast etching dielectric 43 and thickness $t_3$ of slower etching dielectric 41. If the etch rate of dielectric 43 is denoted by $r_1$, and the etch rate of dielectric 21 is denoted by $r_3$, then the desired thickness $t_4$ of dielectric 21 is given by the formula:

$$t_4 = (t_2 - t_1)\frac{r_1}{r_3}.$$

Thus, by judicious choice of the thickness of dielectric 21, together with the relative etch rates of dielectric 43 and 21, one is able to form a planarizable dielectric structure through which openings may be created to runners and junctions (i.e., source or drain) alike with reduced risk of damaging the runners.

It will be noted in FIG. 5 that the upper portion of openings 49 and 47 is tapered. Various etching processes may be used to create the tapered structure shown on the figure. Tapered openings are useful if they are to be subsequently filled with aluminum. Should a tungsten plug process be desired instead, openings 49 and 47 may be created with straight sides.

Should it be desired, an optional silicide layer may be formed over conductor 19. In addition, dielectric 41 may be eliminated if the process designer has no fear of migration of dopants from dielectric 43 into substrate 11.

We claim:

1. A method of integrated circuit manufacture comprising:
   forming a raised topographic feature upon a substrate;
   forming a first layer upon said topographic feature; said first layer not covering said substrate and having a predetermined thickness;
   forming a second layer upon said first layer and upon said substrate;
   planarizing said second layer;
   selectively etching said second layer and said first layer to create first and second openings, said first opening being over said topographic feature, and said second opening being over said substrate;
   the thickness of said first layer being chosen so that said first opening exposes said topographic feature at approximately the same time that said second opening exposes said substrate.

2. The method of claim 1 in which said first layer is formed from TEOS.

3. The method of claim 1 in which said second layer is formed from BPTEOS.

4. The method of claim 1 in which said second layer is a bilayer comprising a layer formed from TEOS under a layer formed from BPTEOS.

5. The method of claim 1 in which the thickness of said first layer is chosen in accord with the formula:

$$t_4 = (t_2 - t_1)\frac{r_1}{r_3}$$

where $t_4$=thickness of first layer, $t_2$=thickness of second layer over substrate, $t_1$=thickness of second layer over topographic feature, $r_1$=etch rate of second layer, $r_3$=etch rate of said first layer.

6. The method of claim 1 in which said first and second openings have tapered sides.

7. The method of claim 1 in which said first and second openings are filled with aluminum.

8. The method of claim 1 in which said topographic feature is a runner.

9. A method of semiconductor integrated circuit fabrication comprising:
   forming a field oxide upon a semiconductor substrate;
   forming source, gate, and drain upon said substrate;
   forming a runner upon said field oxide, said runner having a first layer of TEOS upon it;
   forming a second layer of TEOS over said first layer of TEOS, and contacting said source, gate, and drain;
   forming a layer of BPTEOS over said second layer of TEOS;
   smoothing or planarizing said layer of BPTEOS;
   selectively etching said BPTEOS layer and said first and second TEOS layers to expose said runner and said substrate at approximately the same time.

* * * * *